United States Patent
Chang et al.

(10) Patent No.: US 9,331,054 B2
(45) Date of Patent: May 3, 2016

(54) SEMICONDUCTOR PACKAGE ASSEMBLY WITH DECOUPLING CAPACITOR

(71) Applicant: MediaTek Inc., Hsin-Chu (TW)

(72) Inventors: Sheng-Ming Chang, New Taipei (TW); Tung-Hsien Hsieh, Zhubei (TW); Nan-Cheng Chen, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/188,881

(22) Filed: Feb. 25, 2014

(65) Prior Publication Data

US 2014/0264812 A1 Sep. 18, 2014

Related U.S. Application Data

(60) Provisional application No. 61/782,764, filed on Mar. 14, 2013.

(51) Int. Cl.
*H01L 25/065* (2006.01)
*H01L 25/10* (2006.01)
(Continued)

(52) U.S. Cl.
CPC .......... *H01L 25/0657* (2013.01); *H01L 25/105* (2013.01); *H01L 23/3128* (2013.01); *H01L 24/06* (2013.01); *H01L 24/13* (2013.01); *H01L 24/16* (2013.01); *H01L 24/32* (2013.01); *H01L 24/48* (2013.01); *H01L 24/49* (2013.01); *H01L 24/73* (2013.01); *H01L 24/92* (2013.01); *H01L 25/0655* (2013.01); *H01L 25/16* (2013.01); *H01L 25/18* (2013.01); *H01L 2224/0401* (2013.01); *H01L 2224/04042* (2013.01); *H01L 2224/05553* (2013.01); *H01L 2224/06135* (2013.01);

(Continued)

(58) Field of Classification Search
CPC ......... H01L 23/12; H01L 25/00; H01L 23/31; H01L 23/26; H01L 23/433; H01L 23/48; H01L 25/16; H01L 25/0657; H01L 25/205; H01L 2224/05553; H01L 23/3128; H01L 24/06; H01L 24/13; H01L 24/16; H01L 24/32; H01L 24/48; H01L 24/49; H01L 24/73; H01L 24/92; H01L 25/0655; H01L 25/18; H01L 2224/04042; H01L 2224/06135
USPC ......... 257/659, 777, 685, 686, 723, 778, 737, 257/738, 734, 728, 724, 532, 528, 53, 535, 257/E23.021, E23.211
See application file for complete search history.

(56) References Cited

U.S. PATENT DOCUMENTS

| | | | | |
|---|---|---|---|---|
| 5,841,686 A | * | 11/1998 | Chu | ......... G11C 5/04 365/193 |
| 6,933,613 B2 | * | 8/2005 | Akashi | ......... 257/778 |

(Continued)

*Primary Examiner* — Alexander Oscar Williams
(74) *Attorney, Agent, or Firm* — McClure, Qualey & Rodack, LLP

(57) ABSTRACT

A semiconductor package assembly includes a first semiconductor package. The first semiconductor package includes a first body having a first device-attach surface and a first bump-attach surface opposite to the first device-attach surface. A second semiconductor package is bonded to the first device-attach surface of the first semiconductor package. The second package includes a second body having a second device-attach surface and a second bump-attach surface opposite to the second device-attach surface. A dynamic random access memory (DRAM) device is mounted on the second device-attach surface. A decoupling capacitor is mounted on the second device-attach surface. Conductive structures are disposed on the second bump-attach surface of the second package, connecting to the first bump-attach surface of the first body of the first semiconductor package.

28 Claims, 2 Drawing Sheets

(51) Int. Cl.
    *H01L 23/31*       (2006.01)
    *H01L 23/00*       (2006.01)
    *H01L 25/16*       (2006.01)
    *H01L 25/18*       (2006.01)
    *H05K 1/18*        (2006.01)

(52) U.S. Cl.
    CPC . *H01L2224/131* (2013.01); *H01L 2224/13147* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/49175* (2013.01); *H01L 2224/49433* (2013.01); *H01L 2224/73204* (2013.01); *H01L 2224/73265* (2013.01); *H01L 2224/92125* (2013.01); *H01L 2225/0651* (2013.01); *H01L 2225/06562* (2013.01); *H01L 2225/1023* (2013.01); *H01L 2225/1058* (2013.01); *H01L 2924/1431* (2013.01); *H01L 2924/1436* (2013.01); *H01L 2924/15192* (2013.01); *H01L 2924/15311* (2013.01); *H01L 2924/15331* (2013.01); *H01L 2924/19041* (2013.01); *H01L 2924/19105* (2013.01); *H05K 1/181* (2013.01); *H05K 2201/1053* (2013.01); *H05K 2201/10515* (2013.01)

(56) References Cited

U.S. PATENT DOCUMENTS

| | | | | |
|---|---|---|---|---|
| 7,209,366 | B2* | 4/2007 | Prokofiev et al. | 361/803 |
| 7,799,613 | B2* | 9/2010 | Dang et al. | 438/121 |
| 8,587,096 | B2* | 11/2013 | Kim et al. | 257/659 |
| 8,664,751 | B2* | 3/2014 | Kim et al. | 257/660 |
| 8,674,494 | B2* | 3/2014 | Nam et al. | 257/686 |
| 2005/0207131 | A1* | 9/2005 | Prokofiev et al. | 361/760 |
| 2006/0208348 | A1* | 9/2006 | Ohsaka | H01L 24/97 257/685 |
| 2009/0311828 | A1* | 12/2009 | Andry et al. | 438/107 |
| 2011/0304015 | A1* | 12/2011 | Kim et al. | 257/532 |
| 2011/0316119 | A1* | 12/2011 | Kim et al. | 257/532 |
| 2013/0320547 | A1* | 12/2013 | Zhang et al. | 257/766 |
| 2014/0138815 | A1* | 5/2014 | Yee | 257/737 |
| 2014/0138845 | A1* | 5/2014 | Kulkarni et al. | 257/774 |
| 2014/0151859 | A1* | 6/2014 | Kim et al. | 257/659 |
| 2014/0185264 | A1* | 7/2014 | Chen et al. | 361/814 |
| 2014/0217610 | A1* | 8/2014 | Jeng et al. | 257/774 |

* cited by examiner

SEMICONDUCTOR PACKAGE ASSEMBLY WITH DECOUPLING CAPACITOR

CROSS REFERENCE TO RELATED APPLICATIONS

This application claims the benefit of U.S. Provisional Application No. 61/782,764, filed on, Mar. 14, 2013, the entirety of which is incorporated by reference herein.

BACKGROUND OF THE INVENTION

1. Field of the Invention

The present invention relates to a semiconductor package assembly, and in particular, to a package on package (POP) semiconductor package assembly.

2. Description of the Related Art

Package on package (PoP) package assembly is an integrated circuit packaging method to combine vertically discrete system-on-chip (SOC) and memory packages. Two or more packages are installed atop each other, i.e. stacked, with a standard interface to route signals between them. This allows higher component density in devices, such as mobile phones, personal digital assistants (PDA), and digital cameras.

Due to the increased amount of input/output connections of the bottom SOC package and limitations on the height between the top memory package and the bottom SOC package, it is hard to design additional electronic devices to enhance the performance of the SOC package.

Thus, a novel PoP package assembly is desirable.

BRIEF SUMMARY OF INVENTION

A semiconductor package assembly is provided. An exemplary embodiment of a semiconductor package assembly includes a first semiconductor package. The first semiconductor package includes a first body having a first device-attach surface and a first bump-attach surface opposite to the first device-attach surface. A second semiconductor package is bonded to the first device-attach surface of the first semiconductor package. The second package includes a second body having a second device-attach surface and a second bump-attach surface opposite to the second device-attach surface. A dynamic random access memory (DRAM) device is mounted on the second device-attach surface. A decoupling capacitor is mounted on the second device-attach surface. Conductive structures are disposed on the second bump-attach surface of the second package, connecting to the first bump-attach surface of the first body of the first semiconductor package.

Another exemplary embodiment of a dynamic random access memory (DRAM) package assembly includes a base. A DRAM package is bonded to the base. The DRAM package includes a body. A DRAM device is mounted on the body. A decoupling capacitor is mounted on the body, separated from the DRAM device. An external power supply is disposed on the base, separated from the DRAM package.

Yet another exemplary embodiment of a semiconductor package assembly includes a base. A system-on-chip (SOC) package is bonded to the base. A memory package is bonded to the system-on-chip (SOC) package. The memory package includes a decoupling capacitor mounted thereon. An external power supply is disposed on the base, separated from the system-on-chip (SOC) package.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
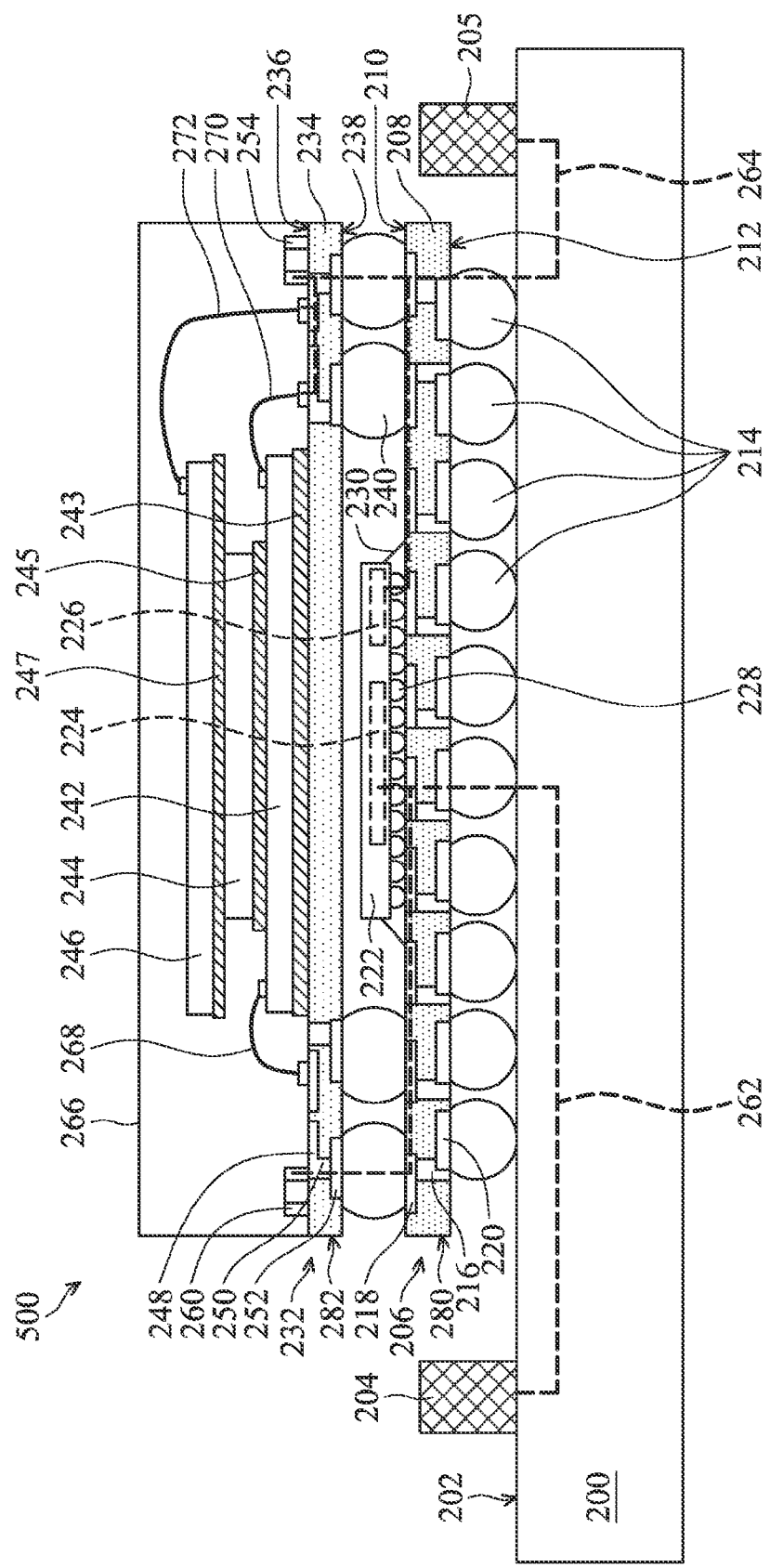
FIG. 1 shows a cross section of one exemplary embodiment of a semiconductor package assembly of the invention.

The following description is a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

Figure 2:
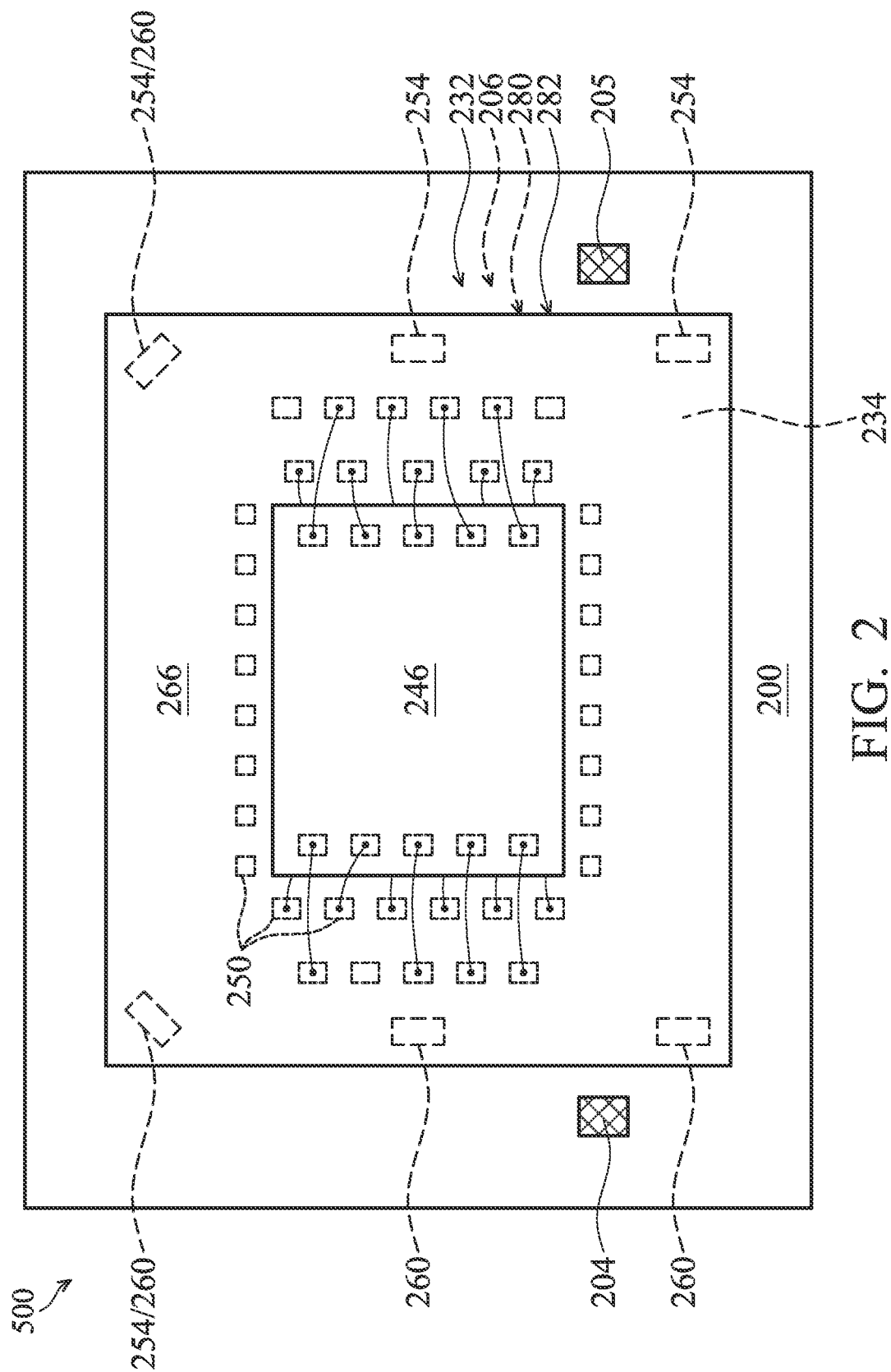
FIG. 2 shows a top view of one exemplary embodiment of a semiconductor package assembly of the invention.

FIG. 1 shows a cross section of one exemplary embodiment of a semiconductor package assembly 500 of the invention. FIG. 2 shows a top view of one exemplary embodiment of a semiconductor package assembly 500 of the invention. In this embodiment, the semiconductor package assembly 500 is a package on package (POP) semiconductor package assembly. In one embodiment, the POP semiconductor package assembly 500 includes at least two vertically stacked wafer-leveled semiconductor packages. In this embodiment, the POP semiconductor package assembly 500 includes a system-on-chip (SOC) package, for example, a logic package, and a memory package, for example, a dynamic random access memory (DRAM) package, stacked on the SOC package. Because a design rule of the memory package is usually larger than that of the SOC package, the memory package may have enough space for a memory device and a decoupling capacitor mounted thereon to reinforce the power delivery network (PDN) of the DRAM of the memory package, or even a central processing unit (CPU) and a graphic processing unit (GPU) of the SOC package. Also, each of the semiconductor packages of the semiconductor package assembly 500 can be a flip chip package using conductive structures, for example copper pillar bumps, connecting a semiconductor device to a base.

Please refer to FIG. 1. The semiconductor package assembly 500 comprises a base 200, a first semiconductor package 206 mounted on the base 200, and a second semiconductor package 232 stacked and mounted on the first semiconductor package 206.

In one embodiment, the base 200, for example a print circuit board (PCB), may be formed of polypropylene (PP). It should also be noted that the base 200 can be a single layer or a multilayer structure. A plurality of conductive traces (not shown) and pads (not shown) is disposed on a device-attach surface 202 of the base 200. In one embodiment, the conductive traces may comprise signal trace segments or ground trace segments, which are used for the input/output (I/O) connections of the first semiconductor package 206. Also, the pads are disposed on the device-attach surface 202, connecting to different terminals of the conductive traces. The pads are used for the first semiconductor package 206 mounted directly thereon.

As shown in FIG. 1, the first semiconductor package 206 is mounted on the device-attach surface 202 of the base 200 by a bonding process. In this embodiment, the first semiconductor package 206 is a system-on-chip (SOC) package, for example a logic package. The first semiconductor package 206 comprises a first body 208 having a first device-attach surface 210 and a first bump-attach surface 212 opposite to the first device-attach surface. The first body 208 may comprise circuitry 216 and metal pads 218 and 220. The metal pads 218 are disposed on the top of the circuitry 216 close to the first device-attach surface 210, and the metal pads 220 are disposed on the bottom of the circuitry 216 close to the first bump-attach surface 212. The circuitry 216 of the first semiconductor package 206 is interconnected with the circuitry of the base 200 via a plurality of first conductive structures 214 disposed on the first bump-attach surface 212 of the first body 208. Also, the first conductive structures 214 are in contact with the base 200. In one embodiment, the first conductive structure 214 may comprise a conductive bump structure such as a copper bump or a solder bump structure, a conductive pillar structure, a conductive wire structure, or a conductive paste structure. A logic device 222 is mounted on the first device-attach surface 210 of the first body 208 through the conductive structure 228 using a flip-chip technology. In one embodiment, the logic device 222 may comprise a central processing unit (CPU), a graphic processing unit (GPU), a dynamic random access memory (DRAM) controller or any combination thereof. In this embodiment, the logic device 222 comprises a CPU and/or GPU 224 and a DRAM controller 226 integrated with the CPU and/or GPU 224. In one embodiment, the conductive structure 228 may comprise a conductive bump structure such as a copper bump or a solder bump structure, a conductive pillar structure, a conductive wire structure, or a conductive paste structure. In one embodiment, an underfill material or the underfill 230 can be introduced into the gap between the logic device 222 and the first body 208. In one embodiment, the underfill 230 may comprises a capillary underfill (CUF), molded underfill (MUF) or a combination thereof. In one embodiment, the logic device 222 is not a flip-chip connection but a wire-bonding connection to the first semiconductor package 206.

Please refer to FIG. 1 again. A second semiconductor package 232 is stacked on the first device-attach surface 210 of the first semiconductor package 206 by a bonding process. In this embodiment, the second semiconductor package 232 is a memory package, for example, a dynamic random access memory (DRAM) package. The second semiconductor package 232 comprises a second body 234 having a second device-attach surface 236 and a second bump-attach surface 238 opposite to the second device-attach surface 236. Similarly to the first body 208, the second body 234 may comprise circuitry 250 and metal pads 248 and 252. The metal pads 248 are disposed on the top of the circuitry 250 close to the second device-attach surface 236, and the metal pads 252 are disposed on the bottom of the circuitry 250 close to the second bump-attach surface 238. The circuitry 250 of the second semiconductor package 232 is interconnected with the circuitry 216 of the first semiconductor package 206 via a plurality of second conductive structures 240 disposed on the second bump-attach surface 238 of the second body 234. Also, the second conductive structures 240 are bonded to and in contact with the first device-attach surface 210 of the first body 208 of the first semiconductor package 206. In one embodiment, the second conductive structures 240 may comprise a conductive bump structure such as a copper bump or a solder bump structure, a conductive pillar structure, a conductive wire structure, or a conductive paste structure. In one embodiment, the second semiconductor package 232 may comprise at least one dynamic random access memory (DRAM) device mounted on the second device-attach surface 236 of the second body 234. In this embodiment, as shown in FIG. 1, there are three DRAM devices 242, 244 and 246 mounted on the second device-attach surface 236 of the second body 234. Also, the DRAM device 242 is mounted on the second device-attach surface 236 of the second body 234 by a paste 243. The DRAM device 244 is stacked on the DRAM device 242 through a paste 245, and the DRAM device 246 is stacked on the DRAM device 244 through a paste 247. The DRAM devices 242, 244 and 246 may be coupled to the second body 234 by bonding wires, for example bonding wires 268, 270 and 272. However, the number of stacked DRAM devices is not limited to the disclosed embodiment. Alternatively, the three DRAM devices 242, 244 and 246 as shown in FIG. 1 can be arranged side by side. Therefore, the DRAM devices 242, 244 and 246 are mounted on the second device-attach surface 236 of the second body 234 by paste.

It is noted that the second semiconductor package 232, for example a memory package 232, is only configured to package at least one memory device. Therefore, a design rule (for example, the pad minimum pitch, the pad size, the critical dimension of the circuitry, etc.) of the second semiconductor package 232 is usually larger than that of the first semiconductor package 206, for example, a SOC package. The second body 234 of the second semiconductor package 232 may have enough space for an additional decoupling capacitor mounted on the second body 234 of the second semiconductor package 232. Also, the second body 234 of the second semiconductor package 232 may include dummy metal pads and circuitry disposed close to its corners. The dummy metal pads and circuitry are configured to release stress on the second body 234 and to prevent damage from the semiconductor package assembly dumping. Therefore, the dummy metal pads and circuitry can be configured for the additional decoupling capacitor mounted thereon and be electrically coupled to the first semiconductor package 206 therethrough. In this embodiment, as shown in FIG. 1, the second semiconductor package 232 further comprises at least one decoupling capacitor mounted on the second device-attach surface 236 of the second body 234. In this embodiment, decoupling capacitors 254 and 260 are mounted on the second device-attach surface 236 of the second body 234. Also, the DRAM devices 242, 244 and 246, and the decoupling capacitors 254 and 260 are discrete devices. That is to say, decoupling capacitors 254 and 260 are separated from the DRAM devices 242, 244 and 246. As shown in FIGS. 1 and 2, because the decoupling capacitors can be designed to be mounted on the second semiconductor package 232 such as a DRAM package with a design rule larger than the first semiconductor package 206 such as a logic package, the first and second semiconductor packages 206 and 232 may keep the original package dimensions without additional area provided for the decoupling capacitors. In one embodiment, as shown in FIGS. 1 and 2, the boundary 280 of the first body 208 of the first semiconductor package 206 such as a logic package (underlying the second semiconductor package 232) can fully overlap with the boundary 282 of the second body 234 of the second semiconductor package 232 in a top view. That is to say, the boundary 282 of the second body 234 of the second semiconductor package 232, such as a DRAM package, can be aligned to the boundary 280 of the first body 208 of the first semiconductor package 206 such as a logic package (underlying the second semiconductor package 232) in a top view.

In one embodiment, as shown in FIG. 1, the second semiconductor package 232 further includes a molding material 266 covering the second device-attach surface 236 of the second body 234, encapsulating the DRAM devices 242, 244 and 246, the bonding wires 268, 270 and 272 and the decoupling capacitors 254 and 260.

Please refer to FIG. 1 again. At least one external power supply is disposed on the device-attach surface 202 of the base 200. In this embodiment, two external power supplies 204 and 205 are disposed on the device-attach surface 202 of the base 200. In one embodiment, the external power supplies 204 and 205 are both separated from the first semiconductor package 206 and the second semiconductor package 232. In this embodiment, the external power supplies 204 and 205 are configured to provide power to the CPU and/or GPU 224 and the DRAM controller 226 of the first semiconductor package 206, and the DRAM devices 242, 244 and 246 of the second semiconductor package 232.

In one embodiment, the decoupling capacitors 254 and 260 may be coupled to the CPU and/or GPU 224 and/or the DRAM controller 226 to provide a compensation current and/or voltage. Also, the decoupling capacitors 254 and 260 can mitigate the simultaneous switching output (SSO) noise from a power source to provide current and/or voltage to the semiconductor package assembly 500. Therefore, the decoupling capacitors 254 and 260 are configured to reinforce the power delivery network (PDN) of the DRAM of the memory package (the second semiconductor package 232), or even a central processing unit (CPU) and a graphic processing unit (GPU) of the SOC package (the first semiconductor package 206). In one embodiment, as shown in FIG. 1, the decoupling capacitor 260 is designed to be coupled to both the CPU and/or GPU 224 of the logic device 222 and the external power supply 204. In this embodiment, the decoupling capacitor 260 is configured to provide a compensation current and/or voltage to the CPU and/or GPU 224 of the logic device 222 of the first semiconductor package 206 through a current path 262 (labeled as a dash-line). Alternatively, the decoupling capacitor 254 is designed to be coupled to the DRAM device 242/244/246, with the DRAM controller 226 integrated with the logic device 222 and the external power supply 205. In this embodiment, the decoupling capacitor 254 is configured to provide a compensation current and/or voltage to the DRAM device 242/244/246 of the second semiconductor package 232 through a current path 264 (labeled as a dash-line). Also, the DRAM device 242/244/246 and the decoupling capacitor 254/260 are coupled to the first semiconductor package 206 through different conductive structures 252 disposed on the second bump-attach surface 238.

Exemplary embodiments provide a semiconductor package assembly, for example, a package on package (POP) semiconductor package assembly, comprising a memory package, for example a dynamic random access memory (DRAM) package, stacked on a SOC package, for example a logic package. The semiconductor package assembly is designed to include additional decoupling capacitors mounted on the memory package due to it having a design rule (for example, the pad minimum pitch, the pad size, the critical dimension of the circuitry, etc.) larger than the SOC package. Also, the additional decoupling capacitor can be mounted on the dummy metal pads and circuitries, which are configured to release stress on the body and to prevent damage from the semiconductor package assembly dumping, of the memory package. In one embodiment, the decoupling capacitors mounted on the memory package may be coupled to a logic device of the SOC package and the external power supply to provide a compensation current and/or voltage to the logic device. Also, the decoupling capacitor may be designed to be coupled to the DRAM device of the memory package, with the DRAM controller of the SOC package and the external power supply to provide a compensation current and/or voltage to the DRAM device. Therefore, the SOC package and the memory package may keep the original package dimensions without additional area provided for the decoupling capacitors.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package assembly, comprising:
   a first semiconductor package, comprising:
      a first body having a first device-attach surface and a first bump-attach surface opposite to the first device-attach surface; and
   a second semiconductor package bonded to the first device-attach surface of the first semiconductor package, wherein the second semiconductor package comprises:
      a second body having a second device-attach surface and a second bump-attach surface opposite to the second device-attach surface;
      a dynamic random access memory (DRAM) device mounted on the second device-attach surface;
      a decoupling capacitor directly mounted on dummy metal pads and circuitry of the second device-attach surface of the second body, and coupled to the first semiconductor package; and
      conductive structures disposed on the second bump-attach surface of the second semiconductor package, connecting to the first device-attach surface of the first body of the first semiconductor package.

2. The semiconductor package assembly as claimed in claim 1, wherein a boundary of the first body fully overlaps with a boundary of the second body in a top view.

3. The semiconductor package assembly as claimed in claim 1, wherein the first semiconductor package further comprises a logic device mounted on the first device-attach surface of the first body.

4. The semiconductor package assembly as claimed in claim 1, wherein the DRAM device and the decoupling capacitor are separated from each other.

5. The semiconductor package assembly as claimed in claim 3, further comprising:
   a base, wherein the first and second semiconductor packages are mounted on the base through the conductive structures of the first semiconductor package; and
   an external power supply disposed on the base, separated from the first and second semiconductor packages.

6. The semiconductor package assembly as claimed in claim 5, wherein the decoupling capacitor is coupled to both the logic device and the external power supply.

7. The semiconductor package assembly as claimed in claim 5, wherein the decoupling capacitor is coupled to the DRAM device, a DRAM controller integrated with the logic device and the external power supply.

8. The semiconductor package assembly as claimed in claim 1, wherein the DRAM device and the decoupling capacitor are coupled to the first semiconductor package through different conductive structures disposed on the second bump-attach surface.

9. The semiconductor package assembly as claimed in claim 1, wherein the second semiconductor package further comprises an additional DRAM device vertically stacked on the DRAM device, electrically coupled to the second body.

10. A semiconductor package assembly, comprising:
a base;
a dynamic random access memory (DRAM) package bonded to the base, wherein the DRAM package comprises:
a body;
a DRAM device mounted on the body; and
a decoupling capacitor directly mounted on dummy metal pads and circuitry of the body and coupled to a logic package of the semiconductor package assembly, separated from the DRAM device; and
an external power supply disposed on the base, separated from the DRAM package.

11. The semiconductor package assembly as claimed in claim 10,
wherein the logic package is disposed between the DRAM package and the base, comprising:
a body having a first device-attach surface and a first bump-attach surface opposite to the first device-attach surface;
a logic device mounted on the first device-attach surface of the body; and
first conductive structures disposed on the first bump-attach surface, in contact with the base.

12. The semiconductor package assembly as claimed in claim 11, wherein the DRAM package bonded to and in contact with the first device-attach surface through second conductive structures disposed on a second bump-attach surface of the body of the DRAM package.

13. The semiconductor package assembly as claimed in claim 12, wherein the body of the DRAM package has a second device-attach surface opposite to the second bump-attach surface, and wherein the DRAM device is mounted on the second device-attach surface.

14. The semiconductor package assembly as claimed in claim 10, wherein a boundary of the body of the DRAM package is aligned to a boundary of the body of a logic package in a top view.

15. The semiconductor package assembly as claimed in claim 11, wherein the decoupling capacitor is coupled to both the logic device and the external power supply.

16. The semiconductor package assembly as claimed in claim 11, wherein the decoupling capacitor is coupled to the DRAM device, a DRAM controller integrated with the logic device and the external power supply.

17. The semiconductor package assembly as claimed in claim 12, wherein the DRAM device and the decoupling capacitor are coupled to the logic package through different conductive structures disposed on the second bump-attach surface.

18. The semiconductor package assembly as claimed in claim 10, wherein the DRAM package further comprises an additional DRAM device vertically stacked on the DRAM device, electrically coupled to the body of the DRAM package.

19. A semiconductor package assembly, comprising:
a base;
a system-on-chip (SOC) package bonded to the base;
a memory package bonded to the system-on-chip (SOC) package, wherein the memory package comprises a decoupling capacitor, wherein the decoupling capacitor is mounted on the dummy metal pads and circuitry of the memory package and coupled to the SOC package; and
an external power supply disposed on the base, separated from the system-on-chip (SOC) package.

20. The semiconductor package assembly as claimed in claim 19, wherein the system-on-chip (SOC) package comprises:
a first body having a first device-attach surface and a first bump-attach surface opposite to the first device-attach surface;
a logic device mounted on the first device-attach surface; and
first conductive structures disposed on the first bump-attach surface, in contact with the base.

21. The semiconductor package assembly as claimed in claim 20, wherein the memory package is a dynamic random access memory (DRAM) package.

22. The semiconductor package assembly as claimed in claim 21, wherein the DRAM package comprises:
a second body having a second device-attach surface and a second bump-attach surface opposite to the second device-attach surface;
a dynamic random access memory (DRAM) device and the decoupling capacitor mounted on the second device-attach surface; and
second conductive structures disposed on the second bump-attach surface of the second body, connecting to the first bump-attach surface of the first body of the system-on-chip (SOC) package.

23. The semiconductor package assembly as claimed in claim 22, wherein the DRAM device and the decoupling capacitor are discrete devices.

24. The semiconductor package assembly as claimed in claim 22, wherein a boundary of the second body of the DRAM package is aligned to a boundary of the first body of the system-on-chip (SOC) package in a top view.

25. The semiconductor package assembly as claimed in claim 20, wherein the decoupling capacitor is coupled to both the logic device and the external power supply.

26. The semiconductor package assembly as claimed in claim 22, wherein the decoupling capacitor is coupled to the DRAM device, a DRAM controller integrated with the logic device and the external power supply.

27. The semiconductor package assembly as claimed in claim 22, wherein the DRAM device and the decoupling capacitor are coupled to the system-on-chip (SOC) package through different conductive structures disposed on the second bump-attach surface.

28. The semiconductor package assembly as claimed in claim 22, wherein the DRAM package further comprises an additional DRAM device vertically stacked on the DRAM device, electrically coupled to the second body.

* * * * *